United States Patent
Sumi et al.

(10) Patent No.: US 9,396,841 B2
(45) Date of Patent: Jul. 19, 2016

(54) NOISE SUPPRESSION CABLE

(71) Applicant: Hitachi Metals, Ltd., Tokyo (JP)

(72) Inventors: Yosuke Sumi, Hitachinaka (JP); Naofumi Chiwata, Mito (JP); Katsuya Akimoto, Hitachi (JP); Katsutoshi Nakatani, Hitachi (JP); Kenji Ajima, Hitachiota (JP); Hiroshi Okikawa, Hitachi (JP); Yasuharu Muto, Kitaibaraki (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 14/606,716

(22) Filed: Jan. 27, 2015

(65) Prior Publication Data
US 2015/0221418 A1   Aug. 6, 2015

(30) Foreign Application Priority Data
Feb. 5, 2014 (JP) ................. 2014-020733

(51) Int. Cl.
*H01B 11/08* (2006.01)
*H01B 11/04* (2006.01)
*H05K 9/00* (2006.01)

(52) U.S. Cl.
CPC ............. *H01B 11/08* (2013.01); *H01B 11/04* (2013.01); *H05K 9/0098* (2013.01)

(58) Field of Classification Search
CPC ................. H01B 11/08; H01B 11/04
USPC ........................................ 174/34
See application file for complete search history.

(56) References Cited

U.S. PATENT DOCUMENTS 6,241,920 B1 * 6/2001 Cotter ............... G02B 6/4416
264/1.24

FOREIGN PATENT DOCUMENTS

| JP | 2000-156124 A | | 6/2000 |
| JP | 2004207085 | * | 7/2004 |
| JP | 2009-277592 A | | 11/2009 |
| JP | 2009277592 | * | 11/2009 |

* cited by examiner

*Primary Examiner* — Timothy Thompson
*Assistant Examiner* — Charles Pizzuto
(74) *Attorney, Agent, or Firm* — McGinn IP Law Group, PLLC

(57) ABSTRACT

A noise suppression cable includes a plurality of twisted pair wires, an inclusion that includes an insulating material and a magnetic powder and separates the plurality of twisted pair wires, and a sheath that includes an insulating material and covers a periphery of the plurality of twisted pair wires and the inclusion.

6 Claims, 2 Drawing Sheets

5 SHEATH WITH CROSS-SHAPED INCLUSION

NOISE SUPPRESSION CABLE

The present application is based on Japanese patent application No. 2014-020733 filed on Feb. 5, 2014, the entire contents of which are incorporated herein by reference.

BACKGROUND OF THE INVENTION

1. Field of the Invention

The invention relates to a noise suppression cable to suppress crosstalk between twisted pair wires.

2. Description of the Related Art

In recent years, LAN (Local Area Network) has been increasingly introduced to offices etc. Information cabling systems constituting the LAN in offices etc. often use as an LAN cable a 4-pair unshielded twisted pair (UTP) cable with four pairs of twisted wires.

The LAN cable is generally constructed such that the four twisted pair wires are isolated from each other by disposing a cross-shaped inclusion among them so as to suppress crosstalk between the twisted pair wires (see e.g. JP-A-2009-277592).

However, since the cross-shaped inclusion in the LAN cable serves only to increase the distance between the twisted pair wires, the crosstalk between the twisted pair wires cannot be sufficiently suppressed. Therefore, a pair cable has been proposed in which a shield layer is disposed at the periphery of each of the twisted pair wires (see e.g. JP-A-2000-156124).

SUMMARY OF THE INVENTION

The pair cable disclosed in JP-A-2000-156124 is formed with the shield layer disposed at periphery of each of the twisted pair wires and, therefore, it is more costly than a cable with a shield layer covering all of the twisted pair wires. Further, the shield layer needs to be removed when connecting a connector to the end of the cable during installation work and, thus, it takes a further work and time.

It is an object of the invention to provide a noise suppression cable that allows the easy connection of the connector thereto while sufficiently suppressing the crosstalk between twisted pair wires.

(1) According to one embodiment of the invention, a noise suppression cable comprises:
a plurality of twisted pair wires;
an inclusion that comprises an insulating material and a magnetic powder and separates the plurality of twisted pair wires; and
a sheath that comprises an insulating material and covers a periphery of the plurality of twisted pair wires and the inclusion.

In the above embodiment (1) of the invention, the following modifications and changes can be made.

(i) The magnetic powder and the insulating material in the inclusion are mixed in a ratio of 5 vol % to 60 vol %.

(ii) The insulating material comprises a resin, and wherein the inclusion is formed by extrusion molding.

(2) According to another embodiment of the invention, a noise suppression cable comprises:
a plurality of twisted pair wires; and
a sheath that comprises an insulating material and a magnetic powder, separates the plurality of twisted pair wires and covers a periphery of the plurality of twisted pair wires.

In the above embodiment (2) of the invention, the following modifications and changes can be made.

(iii) The magnetic powder and the insulating material in the sheath are mixed in a ratio of 5 vol % to 60 vol %.

(iv) The insulating material comprises a resin, and wherein the sheath is formed by extrusion molding.

Effects of the Invention

According to one embodiment of the invention, a noise suppression cable can be provided that allows the easy connection of the connector thereto while sufficiently suppressing the crosstalk between twisted pair wires.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

Figure 1:
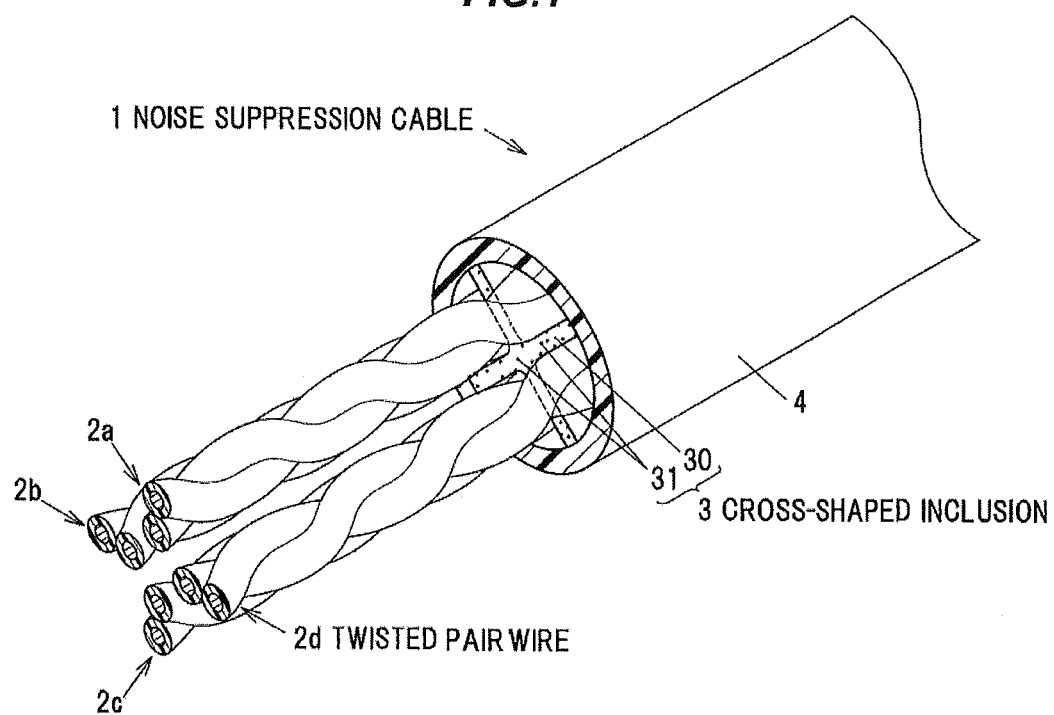
FIG. 1 is a perspective view showing a general configuration of a noise suppression cable in a first embodiment of the present invention.

Embodiments of the invention will be described below in reference to the drawings. It should be noted that constituent elements having substantially the same functions are denoted by the same reference numerals in each drawing and the overlapping explanation thereof will be omitted.

First Embodiment

Figure 2:
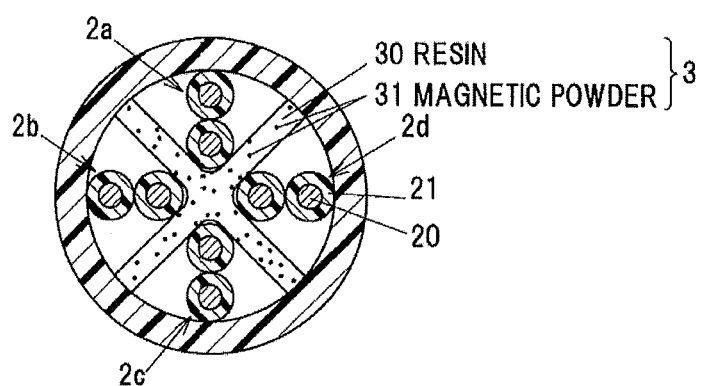
FIG. 2 is a cross sectional view showing the noise suppression cable shown in FIG. 1.

FIG. 1 is a perspective view showing a general configuration of a noise suppression cable in the first embodiment of the invention. FIG. 2 is a cross sectional view showing the noise suppression cable shown in FIG. 1.

A noise suppression cable 1 is provided with plural twisted pair wires 2a to 2d (four pairs in the first embodiment), a cross-shaped inclusion 3 formed of a resin 30 as an insulating material containing a magnetic powder 31 mixed therewith and separating the plural twisted pair wires 2a to 2d, and a sheath 4 formed of an insulating material and covering around the plural twisted pair wires 2a to 2d and the cross-shaped inclusion 3.

In the twisted pair wires 2a to 2d, a periphery of each conductor wire 20 is covered with an insulation 21. The twisted pair wires 2a to 2d transmit signals of, e.g., 1 MHz to 10 GHz. The conductor wire 20 may be either a solid wire or plural twisted thin metal wires. The number of twisted pair wires is not limited to four and may be, e.g., two, three, or five or more.

Configuration of Cross-Shaped Inclusion

The cross-shaped inclusion 3 has, e.g., a cross-shaped cross section. A mixture ratio of the magnetic powder 31 to the resin 30 constituting the cross-shaped inclusion 3 is exemplarily 5 to 60 vol %, more exemplarily, 10 to 40 vol % in view of both cable processability and a noise suppression effect.

As the base resin 30, it is possible to use, e.g., vinyl chloride resin, ethylene vinyl acetate polymer, fluorine-based resin and silicone-based resin, etc.

The magnetic powder 31 is exemplarily formed of a soft magnetic material with a small coercive force and high magnetic permeability in order to suppress electromagnetic wave noise. As the soft magnetic material, it is possible to use, e.g., Ni—Cu—Zn ferrite powder, Ni—Zn ferrite powder, Mn—Zn ferrite powder and soft magnetic metal powder, etc. The magnetic powder 31 may be in the granular form, the flat form or the fibrous form, etc.

The cross-shaped inclusion 3 is formed by, e.g., extrusion molding of the resin 30 containing the magnetic powder 31 mixed therewith. Alternatively, the cross-shaped inclusion 3 may be formed by injection molding.

Sheath

The sheath 4 can be formed of, e.g., vinyl chloride resin, ethylene vinyl acetate polymer, fluorine-based resin and silicone-based resin, etc., in the same manner as the resin 30 which is used as a base of the cross-shaped inclusion 3.

Functions and Effects of the First Embodiment

The following functions and effects are obtained in the first embodiment.

(1) The twisted pair wires 2a to 2d are separated from each other by the cross-shaped inclusion 3 and electromagnetic wave noise generated by the twisted pair wires 2a to 2d is suppressed by the magnetic powder mixed in the cross-shaped inclusion 3. Therefore, it is possible to sufficiently suppress crosstalk between the twisted pair wires 2a to 2d.

(2) A shield layer is not provided on the outer peripheries of the twisted pair wires 2a to 2d and time-consuming work at the time of connecting to a connector is thus eliminated.

(3) Since a member for suppressing crosstalk is not separately provided, it is possible to prevent an increase in the number of components.

Second Embodiment

Figure 3:
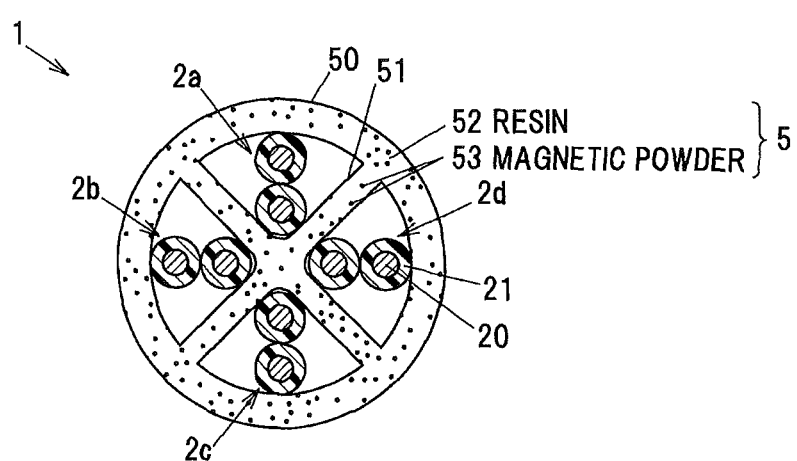
FIG. 3 is a cross sectional view showing a noise suppression cable in a second embodiment of the invention.

FIG. 3 is a cross sectional view showing a noise suppression cable in the second embodiment of the invention. While a cross-shaped inclusion containing magnetic powder is provided in the first embodiment, a sheath and an inclusion both contain magnetic powder and are combined in the second embodiment.

The noise suppression cable 1 in the second embodiment is provided with the plural twisted pair wires 2a to 2d (four pairs in the second embodiment), and a sheath with cross-shaped inclusion 5 which is formed of a resin 52 as an insulating material containing a magnetic powder 53 mixed therewith, separates the plural twisted pair wires 2a to 2d and covers around the plural twisted pair wires 2a to 2d.

The sheath with cross-shaped inclusion 5 is provided with an annular-shaped covering portion 50 and a cross-shaped inclusion 51 of which edges are connected to an inner peripheral surface of the covering portion 50. The cross-shaped inclusion 51 separates the four twisted pair wires 2a to 2d from each other. The sheath with cross-shaped inclusion 5 is formed by, e.g., extrusion molding of the resin 52 containing the magnetic powder 53 mixed therewith. Alternatively, the sheath with cross-shaped inclusion 5 may be formed by injection molding.

Functions and Effects of the Second Embodiment

In the second embodiment, time-consuming work at the time of connecting to a connector is eliminated and it is possible to suppress crosstalk between twisted pair wires in the same manner as the first embodiment. In addition, since the covering portion 50 and the cross-shaped inclusion 51 are formed as an integrated component, it is possible to simplify the manufacturing process.

It should be noted that embodiments of the invention are not limited to those described above and various kinds of embodiments can be implemented. For example, an insulating material of the cross-shaped inclusion 3 in the first embodiment or the sheath with cross-shaped inclusion 5 in the second embodiment may be a rubber instead of the resin. As the rubber, it is possible to use natural rubbers or synthetic rubbers such as chloroprene rubber, polybutadiene rubber, polyisoprene rubber, ethylene-propylene rubber, acrylonitrile-butadiene rubber, isobutylene-isopropylene rubber and styrene-butadiene rubber, etc.

In addition, although the twisted pair wires 2a to 2d are separated by the cross-shaped inclusion 3 having a cross-shaped cross section in the first embodiment, the shape of the inclusion is not limited to the cross shape. For example, the inclusion may be formed in a T-shape so that two twisted pair wires are arranged in a large space and one twisted pair wire is arranged in each of two small spaces.

What is claimed is:

1. A noise suppression cable, comprising:
 a plurality of twisted pair wires;
 an inclusion that comprises an insulating material and a magnetic powder and separates the plurality of twisted pair wires; and
 a sheath that comprises an insulating material and covers a periphery of the plurality of twisted pair wires and the inclusion.

2. The noise suppression cable according to claim 1, wherein the magnetic powder and the insulating material in the inclusion are mixed in a ratio of 5 vol % to 60 vol %.

3. The noise suppression cable according to claim 1, wherein the insulating material comprises a resin, and
 wherein the inclusion is formed by extrusion molding.

4. A noise suppression cable, comprising:
 a plurality of twisted pair wires; and
 a sheath that comprises an insulating material and a magnetic powder, separates the plurality of twisted pair wires and covers a periphery of the plurality of twisted pair wires.

5. The noise suppression cable according to claim 4, wherein the magnetic powder and the insulating material in the sheath are mixed in a ratio of 5 vol % to 60 vol %.

6. The noise suppression cable according to claim 4, wherein the insulating material comprises a resin, and
 wherein the sheath is formed by extrusion molding.

* * * * *